United States Patent [19]

Kuniyoshi et al.

[11] Patent Number: 4,614,432
[45] Date of Patent: Sep. 30, 1986

[54] PATTERN DETECTOR

[75] Inventors: Shinji Kuniyoshi, Tokyo; Tsuneo Terasawa, Hachioji; Toshiei Kurosaki, Tokyo; Yoshio Kawamura, Tokyo; Sumio Hosaka, Tokyo; Akihiro Takanashi, Kokubunji, all of Japan

[73] Assignee: Hitachi, Ltd., Tokyo, Japan

[21] Appl. No.: 545,642

[22] Filed: Oct. 26, 1983

[30] Foreign Application Priority Data

Oct. 29, 1982 [JP] Japan .................. 57-189047

[51] Int. Cl.$^4$ ............................................ G01B 11/00
[52] U.S. Cl. ................................. 356/401; 250/548; 250/557; 355/43; 355/45
[58] Field of Search ............. 356/399, 400, 401; 355/43, 45, 53; 250/548, 557, 561

[56] References Cited

U.S. PATENT DOCUMENTS

| | | | |
|---|---|---|---|
| 4,295,735 | 10/1981 | Lacombat et al. | 355/43 |
| 4,380,395 | 4/1983 | Kuniyoshi et al. | 356/401 |
| 4,492,459 | 1/1985 | Omata et al. | 356/401 |
| 4,498,762 | 2/1985 | Uehara et al. | 356/401 X |

FOREIGN PATENT DOCUMENTS

| | | | |
|---|---|---|---|
| 0017759 | 10/1980 | European Pat. Off. | 355/45 |
| 1382148 | 1/1975 | United Kingdom | 355/45 |

OTHER PUBLICATIONS

Khoury et al, *IBM Technical Disclosure Bulletin*, vol. 13, No. 3, Aug. 1970, pp. 768 and 769.

*Primary Examiner*—F. L. Evans
*Attorney, Agent, or Firm*—Antonelli, Terry & Wands

[57] ABSTRACT

A pattern detector for precise position measurement of a wafer, used in a mask aligner used in manufacturing a semiconductor device is disclosed. A positioning pattern on the wafer is magnified and projected by a magnifying optical system and the magnified projected image is precisely detected to determine a position of the positioning pattern. As a light to form the magnified projected image, plurality of monochromatic lights of different wavelengths are available through optical filters and the magnifying optical systems are arranged one for each of the monochromatic lights. By selecting one of the optical filters, the magnified projected image of the positioning pattern is formed by the monochromatic light having an optimum wavelength to the wafer and the precise position of the positioning pattern on the wafer can be detected.

16 Claims, 5 Drawing Figures

PATTERN DETECTOR

BACKGROUND OF THE INVENTION

1. Field of the Invention

The present invention relates to a pattern detector used in precise position measurement of a wafer or a mask in a mask aligner during the manufacture of a semiconductor device.

2. Description of the Prior Art

FIG. 1 shows a pattern detector in a prior art reduction projection aligner system. A similar device is disclosed in Japanese Patent Application Laid-Open No. 162227/80 (corresponding to U.S. Pat. No. 4,380,395).

In the reduction projection aligner system of FIG. 1, a circuit pattern of a reticle 2 to be newly formed is superimposed on a circuit pattern on a wafer 4 formed in a previous step through an exposing condenser lens 1 and a reduction lens 3. Usually, the superimposing step is repeated for a certain number of reticles to form a desired circuit pattern on the wafer. Usually, a high precision of no less than 1 μm is required for the registration of the two circuit patterns to be superimposed. In the reduction projection aligner system shown in FIG. 1, the registration is effected by detecting a positioning pattern on the wafer and relatively moving the reticle having the pattern to be newly formed so that it coincides with the wafer. An area containing the positioning pattern (not shown) on the wafer 4 is locally illuminated by a light ray emanated from a positioning pattern detection light source (not shown) and guided by a light guide 10, and a light reflected thereby is magnified and focused through the reduction lens 3, the reticle 2, a mirror 100 and a magnifying optical system 5 on a moving plane of a reciprocating table 7 having a slit 6. The reciprocating table 7 is reciprocated in the direction of arrow shown in the figure and the magnified image of the area containing the positioning pattern on the wafer 4 is scanned by the slit 6 reciprocating in accordance with the movement of the reciprocating table 7. The intensity of illumination of the magnified image is applied to a photo-multiplier 9 as a transmitted light from the slit and it is photo-electrically converted. An output of the photo-multiplier 9 is digitized by a circuit including an A-D converter, a digital counter and a CPU and an illumination-intensity data of points corresponding to slit positions of the magnified image is produced. Numeral 8 denotes a portion of a mechanism for generating an input signal to the digital counter. The wafer position (that is, a center position of the positioning pattern on the wafer 4) can be determined in the following manner (see Japanese Patent Application Laid-Open No. 69063/78, corresponding to U.S. Pat. No. 4,115,762). An arbitrary position Xi of the slit is assumed as a virtual center and 2m intensity data Yi on both sides thereof are superimposed to calculate Zi=

$$\sum_{j=1}^{m} (Y_{i+j} - Y_{i-j})^2.$$

A point which provides a minimum one of the values of Z is determined as the center position of the positioning pattern on the wafer. In this device, the center position $X_c$ of the positioning pattern on the wafer relative to an origin sensor (not shown) located at a position on the reciprocating table 7 corresponding to a center position of the reticle reference pattern is determined and the new pattern is superimposed on the pattern on the wafer in accordance with the result of the determination.

In the above reduction projection aligner system, when the pattern position is detected through the reduction lens 3, a detecting light wavelength is an exposure wavelength of monochromatic light because the reduction lens 3 is compensated for aberration for the exposure wavelength. When a monochromatic light is applied to a wafer having an optically transparent thin film photoresist applied thereon, the light reflected by the surface of the wafer is repeatedly reflected between the wafer surface and the photoresist surface and goes out of the photoresist surface. An interference occurs among the light from the photoresist surface, the light from the wafer surface and the repeatedly reflected light in the photoresist, and a so-called interference fringe of equal thickness occurs. Accordingly, when the monochromatic light such as exposure light is used as the pattern detecting light, the interference fringe of equal thickness occurs depending on the thickness of the photoresist. This results in a reduction of a contrast of the detection signal by dark areas of the interference fringe and hence the precision of the pattern positioning is lowered. Further, since the reflection of the exposure light by the wafer impedes the formation of a fine pattern, an anti-reflection film is overlayed on the wafer or light absorbing agent for the exposure light wavelength is added in the photoresist. In such a case, a sufficient intensity of reflected light from the wafer is not obtained if the detection is made using the exposure light wavelength. In order to resolve this problem, it is necessary to detect the pattern by a light of different wavelength than the exposure light wavelength. To this end, a color aberration correction lens is disposed between the reduction lens 3 and the reticle 2 or a special pattern detecting optical system adapted exclusively to a color aberration of the reduction lens 3 is prepared to detect the pattern only by a light of a specific wavelength. As a result, a pattern detection error occurs due to a reproduction error of a correction lens position. Even if the light of different wavelength than the exposure light wavelength is used, the pattern detecting magnifying optical system for a single wavelength cannot vary the detecting wavelength depending on the thickness of the photoresist on the wafer, the material of the photoresist and the material of the wafer to detect the pattern at an optimum wavelength. Namely, it cannot detect the pattern at any desired wavelength.

SUMMARY OF THE INVENTION

It is an object of the present invention to attain a high precision of pattern positioning.

In accordance with one aspect of the present invention, in a pattern position detector which illuminates a positioning pattern on a wafer by a light from a light source, magnifies and projects a light reflected from the positioning pattern by a magnifying optical system and detects the position of the positioning pattern on the wafer on the basis of the magnified projected image, a plurality of optical filters are exchangeably arranged in an optical path between the light source and the magnified projected image imaged through the positioning pattern on the wafer so that a monochromatic light of a desired wavelength is available by selecting one of those filters, and magnifying optical systems are provided one for each of the available monochromatic lights whereby a magnified projected image having a highest contrast is obtained. Thus, the positioning pattern on the wafer can be detected by a desired light having the optimum wavelength to the wafer.

In accordance with another aspect of the present invention, the wavelength of the monochromatic light is varied to effectively utilize an interference fringe of equal thickness so that the positioning pattern is illuminated by intensity-emphasized area of the interference fringe.

In accordance with a further aspect of the present invention, the pattern position is detected without using a color aberration correction lens for correcting a color aberration of the reduction lens. Therefore, a pattern detection error due to a reproduction error of the correction lens position by exchanging the correction lenses does not occur.

DESCRIPTION OF THE PREFERRED EMBODIMENTS

Figure 2:
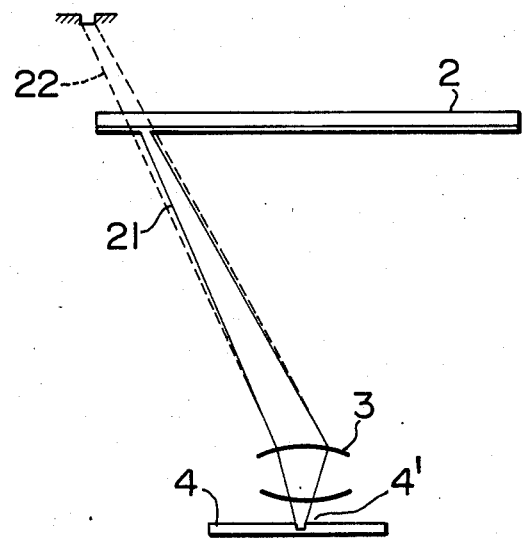
FIG. 2 is a conceptual view illustrating a color aberration of a reduction lens.
Figure 3:
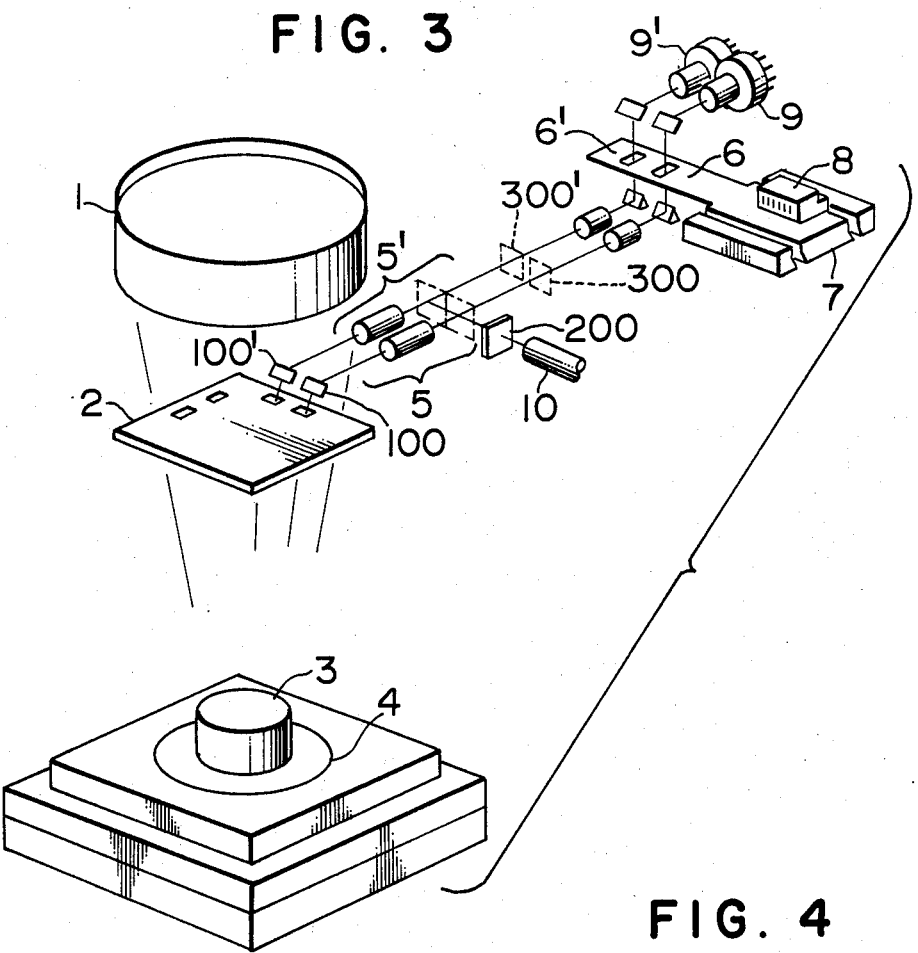
FIG. 3 shows one embodiment of the present invention.

Referring to FIG. 2, a color aberration of a reduction lens is explained. A positioning pattern 4' on a wafer 4 is imaged in magnified scale on a reticle 2 as shown by solid lines 21 by a violet exposure light, which is used to project a circuit pattern on the reticle 2 onto the wafer 4 through an exposing condenser lens 1 and a reduction lens 3 as shown in FIG. 3. When a monochromatic light of different wavelength than the exposure light wavelength, for example green light is used, the pattern is not imaged on the reticle 2 but imaged in magnified scale above the reticle 2 as shown by broken lines 22.

Figure 1:
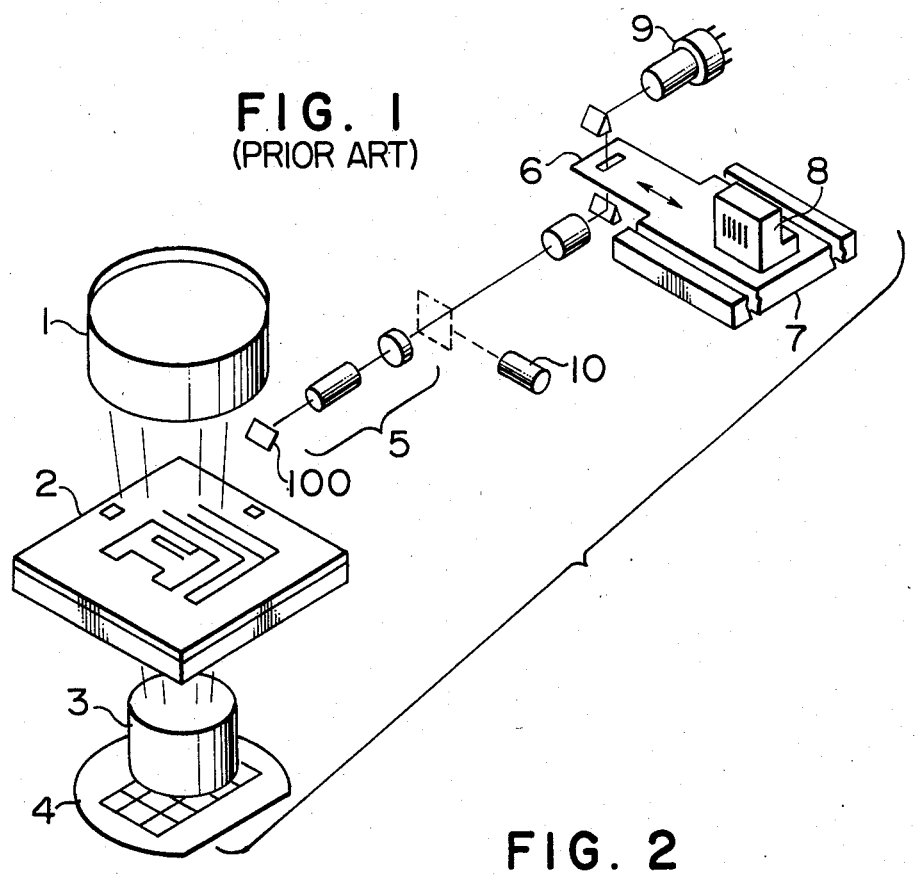
FIG. 1 is a basic configuration of a reducing projection aligner system having a prior art pattern detector.

FIG. 3 shows one embodiment of the present invention, which has detecting optical systems, one for the magnified image by the exposure light wavelength and one for the magnified image by the green light. The like elements to those of FIG. 1 are designated by the like numerals.

In the embodiment of FIG. 3, the pattern on the wafer imaged on the reticle by the exposure light wavelength is magnified and projected on the moving plane of the reciprocating table 7 by the reflection mirror 100 and the magnifying optical system 5 and the intensity of the magnified projected image is transmitted through the slit 6 and photo-electrically converted by the photo-multiplier 9. On the other hand, when a wafer which does not provide a sufficient amount of reflection at the exposure light wavelength is to be detected, the green monochromatic light is used and the pattern imaged above the reticle is magnified and projected to the moving plane of the reciprocating table 7 by a reflection mirror 100' and a magnifying optical system 5' provided for the green monochromatic light, and the intensity of the green magnified projected image is transmitted through a slit 6' and photo-electrically converted by a photo-multiplier 9'. Thus, a detection signal having a sufficient contrast is produced. The wavelength of the detecting monochromatic light (green in the present embodiment), that is, the wavelength of the monochromatic light for forming the magnified projected image of the pattern can be selected by exchanging an optical filter 200 disposed at an inlet or an exit of the light guide 10 made by an optical fiber or exchanging an optical filter 300 or 300' disposed in the magnifying optical system 5 or 5' to extract the monochromatic light of the desired wavelength from the detecting light source (not shown) disposed in front of the light guide 10.

As described above, when the color aberration of the reduction lens is so large that the imaging position varies from wavelength to wavelength, the magnifying optical systems are provided one for each of the monochromatic lights of different wavelengths extracted through the optical filters of different optical characteristics so that the magnified image by the monochromatic light of the desired wavelength is formed on the moving plane of the reciprocating table 7.

Where the color aberration of the reduction lens is small, only one magnifying optical system may be used and a desired one of the optical filters is selected in the same manner as the present embodiment to detect the pattern position by the monochromatic light of the desired wavelength.

Figure 4:
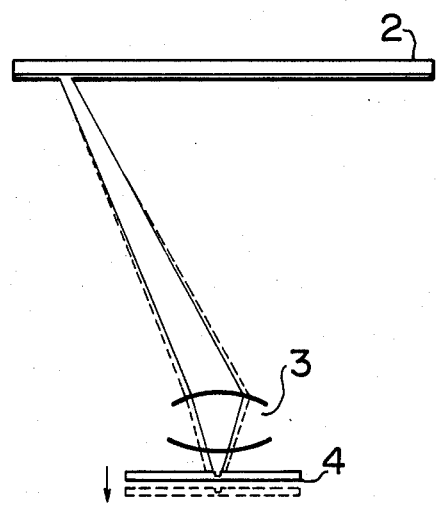
FIG. 4 illustrates a principle of color aberration correction or image position correction of the reduction lens by vertical movement of a wafer.
Figure 5:
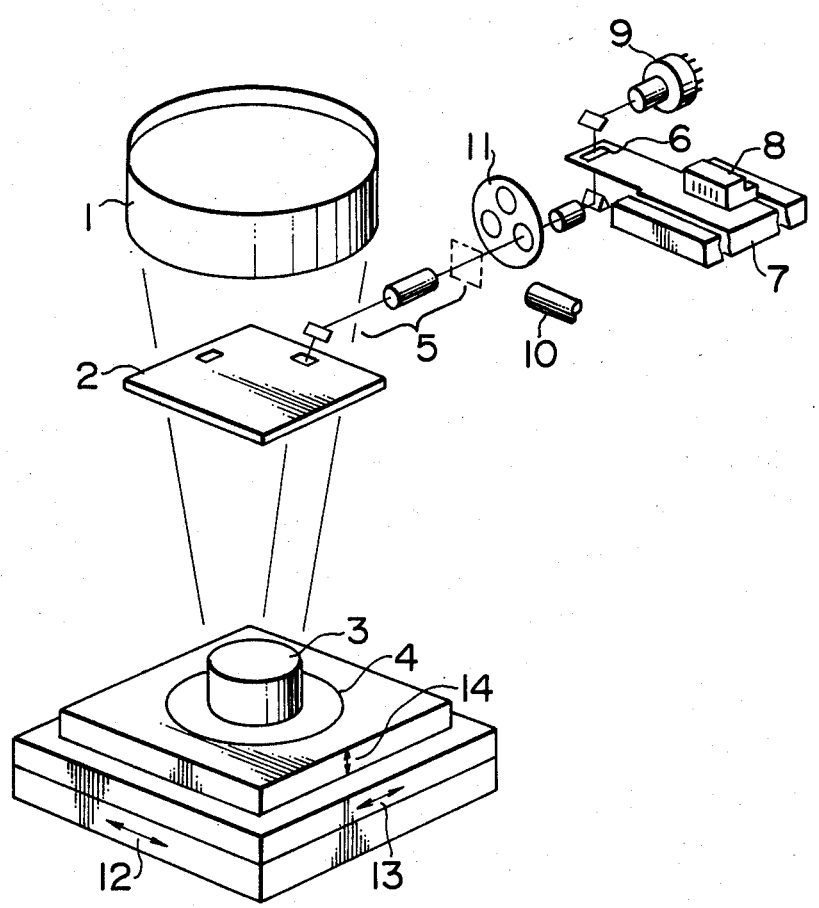
FIG. 5 shows another embodiment of the present invention.

In the present embodiment, two reflection mirrors are used and the magnifying optical systems are arranged in parallel. Alternatively, at least one of the reflection mirrors 100, 100' may be formed as a beam splitter. Of the lights reflected by the positioning pattern on the wafer 4, the monochromatic light of the selected wavelength is extracted and reflected by the beam splitter to detect the pattern and the lights of other wavelengths are transmitted so that two detection light axes per positioning pattern on the wafer are formed. The light of other wavelengths may be passed through the optical filters to produce the monochromatic lights of desired wavelengths or a plurality of beam splitters may be superimposed on the above beam splitter to produce the monochromatic lights of other wavelengths. The beam splitters are followed by the corresponding magnifying optical systems. When the beam splitters are used, only one transparent pattern on an edge of the reticle through which the light reflected by the wafer is transmitted is needed.

Where the color aberration of the reduction lens is so large that the imaging position of the positioning pattern on the wafer by the reduction lens varies from wavelength to wavelength of the detecting monochromatic light, a distance between the wafer and the reduction lens may be changed to correct the imaging position to precisely detect the positioning pattern. For example, the wafer is vertically moved depending on the wavelength used so that the pattern on the wafer is imaged on the reticle irrespective of the wavelength used. FIG. 4 illustrates a principle of an optical system which attains the above concept. As shown in FIG. 4, when the green light is used, the wafer is descended by a predetermined distance from the wafer position at which the pattern on the wafer is imaged on the reticle when the exposure light wavelength is used. Thus, the pattern on the wafer is imaged on the reticle by the green light. One embodiment of the present invention based on this principle is shown in FIG. 5, in which the like elements to those of FIGS. 1 and 3 are designated by the like numerals. In the present embodiment, the wafer 4 is mounted on a moving table comprising an X-direction moving table 13, a Y-direction moving table and a Z-direction moving table 14 so that it is movable in X, Y and Z directions. A filter device 11 having a plurality of filters is arranged in the magnifying optical system. The pattern detection by the exposure light wavelength is carried out in a conventional manner. When the green light is used, the wafer is lowered by a predetermined distance so that the image focused on the reticle is focused on the slit 6 through the green optical filter. Since no additional optical part is required in the focusing optical system between the wafer and the reticle due to the change of the wavelength, no pattern detection error due to the addition of the optical part occurs. In the present embodiment, the wafer is vertically moved to correct the color aberration (and hence the imaging position) due to the change of the wavelength. Alternatively, the reduction lens, the reticle or the pattern detecting optical system may be raised to focus the pattern on the wafer onto the reticle. When the color aberration of the reduction lens is so small that the variation of the imaging position can be neglected, the detecting light wavelength may be selected by merely changing the optical filter.

As described hereinabove, according to the present invention, the pattern detection by various wavelengths is attained. Thus, by selecting the detecting wavelength depending on the thickness of the photoresist on the wafer, the material of the photoresist and the material of the wafer substrate, the detection signal of high contrast can be always produced. Since the optical part such as correction lens need not be inserted, a high precision of pattern detection is attained.

Further, by effectively utilizing the interference fringe of equal thickness which occurs when monochromatic detecting light is used, a high contrast detection signal is produced.

We claim:

1. A pattern position detector for detecting a postion of a positioning pattern on a wafer on the basis of a magnified projected image of said positioning pattern formed by a reflected light from said positioning pattern illuminated by a light, comprising:
    (a) magnifying optical system means for magnifying and projecting said reflected light from said pattern to form said magnified projected image; and
    (b) monochromatic light selection means for selecting a monochromatic light of a desired wavelength out of a plurality of monochromatic lights contained in said light as the light for forming said magnified projected image of said pattern, whereby a magnified projected image having a highest contrast is obtained by selecting the monochromatic light of the desired wavelength which is suitable.

2. A pattern position detector according to claim 1 wherein said monochromatic light selection means includes a plurality of optical filters having different optical characteristics from each other, one of said filters corresponding to said desired wavelength being selected to transmit the monochromatic light of said desired wavelength.

3. A pattern position detector according to claim 2 wherein said magnifying optical system means includes a plurality of magnifying optical systems one for each of monochromatic lights transmitted through said plurality of filters.

4. A pattern position detector according to claim 1 wherein said monochromatic light selection means includes a plurality of beam splitters having different optical characteristics from each other, and said magnifying optical system means includes a plurality of magnifying optical systems one for each of a plurality of monochromatic lights of different wavelengths including said desired wavelength derived from said plurality of beam splitters.

5. A pattern position detector for detecting a positioning pattern on a wafer to align a reticle with said wafer in a reduction projection aligner system for directly projecting a pattern on said reticle onto a predetermined position on said wafer through a reduction lens, comprising:
    (a) a light guide for guiding a light to illuminate said positioning pattern;
    (b) magnifying optical system means for magnifying sand projecting an image imaged by reflected light from said positioning pattern through said reduction lens;
    (c) monochromatic light selector means arranged in a light path between said light guide and a magnified projected image of said positioning pattern formed by said magnifying optical system means for selecting a monochromatic light of a desired wavelength as the light for forming said magnified projected image; and
    (d) means for detecting a position of the magnified projected image of said positioning pattern.

6. A pattern position detector according to claim 5 wherein said monochromatic light selector means includes a plurality of optical filters through which a plurality of monochromatic lights of different wavelengths are emitted.

7. A pattern position detector according to claim 6 wherein said magnifying optical system means includes a plurality of magnifying optical systems one for each of said plurality of monochromatic lights 8. A pattern position detector according to claim 6 further comprising means for correcting a focusing position depending on the selected wavelength of the monochromatic light.

9. A pattern position detector according to calim 8 wherein said correction means includes means for shifting the position of said wafer.

10. A pattern position detector for detecting a position of a positioning pattern on a wafer on the basis of a magnified projected image of said positioning pattern formed by a reflected light from said positioning pattern illuminated by a light, comprising:
    a plurality of magnifying optical systems one for each of a plurality of monochromatic lights having different wavelengths from each other, each magnifying optical system for magnifying and projecting a reflected image of said positioning pattern formed by the corresponding monochromatic light contained in said light illuminating said positioning pattern;
    monochromatic light selection means for selecting a monochromatic light of a desired wavelength to form a magnified projected image of said positioning pattern through the magnified optical system corresponding to said selected monochromatic light, said monochromatic light selection means including means for deriving said plurality of monochromatic lights contained in said light.

11. A pattern position detected according to claim 10, further comprising means for correcting a focusing position of said reflected image of said positioning pattern.

12. A pattern position detector according to claim 10, wherein said deriving means includes a plurality of optical filters one for each of said plurality of monochromatic lights.

13. A pattern position detector according to claim 10, wherein said deriving means includes a plurality of beam splitters having different optical characteristics from each other.

14. A pattern position detector for detecting a positioning pattern on a wafer to align a reticle with said wafer in a reduction projection aligner system for directly projecting a pattern on said reticle onto a predetermined position on said wafer through a reduction lens, comprising:
 (a) a light guide for guiding a light to illuminate said positioning pattern;
 (b) magnifying optical systems one for each of a plurality of monochromatic lights having different wavelengths from each other, each magnifying optical system for magnifying and projecting a reflected image of said positioning pattern formed by the corresponding monochromatic light contained in said light illuminating said positioning pattern;
 (c) a monochromatic light selector for selecting a monochromatic light of a desired wavelength to form a magnified projected image of said positioning pattern formed through the magnifying optical system corresponding to the selected monochromatic light; and
 (d) means for detecting a position of said magnified projected image of said positioning pattern formed by said selected monochromatic light through said corresponding magnifying optical system.

15. A pattern position detector according to claim 14, wherein said monochromatic light selector includes a plurality of optical filters one of said optical filters arranged in a light path of each of said monochromatic lights.

16. A pattern position detector according to claim 14, wherein said monochromatic light selector includes a plurality of beam splitters for extracting said plurality of monochromatic lights out of the reflected light from said pattern on said wafer.

* * * * *